United States Patent
Lin et al.

(10) Patent No.: US 7,432,181 B2
(45) Date of Patent: Oct. 7, 2008

(54) METHOD OF FORMING SELF-ALIGNED SILICIDES

(75) Inventors: Yei-Hsiung Lin, Hsinchu (TW); Steven Huang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 11/004,949

(22) Filed: Dec. 7, 2004

(65) Prior Publication Data

US 2006/0121708 A1    Jun. 8, 2006

(51) Int. Cl.
*H01L 21/28* (2006.01)
*H01L 21/44* (2006.01)
*H01L 21/302* (2006.01)
*H01L 21/461* (2006.01)

(52) U.S. Cl. .................. 438/583; 438/581; 438/630; 438/755

(58) Field of Classification Search ............ 438/583, 438/581, 630, 649, 651, 655, 682, 755, 200, 438/275

See application file for complete search history.

(56) References Cited

U.S. PATENT DOCUMENTS

| 5,064,773 | A | * | 11/1991 | Feist ........................ 438/234 |
| 5,792,684 | A | * | 8/1998 | Lee et al. ................... 438/238 |
| 6,100,145 | A | * | 8/2000 | Kepler et al. ............... 438/300 |
| 6,177,304 | B1 | * | 1/2001 | Li et al. ..................... 438/233 |
| 6,693,001 | B2 | * | 2/2004 | Nishihara et al. .......... 438/199 |
| 6,867,130 | B1 | * | 3/2005 | Karlsson et al. ........... 438/655 |
| 7,157,731 | B2 | * | 1/2007 | Taniguchi et al. ........... 257/37 |

\* cited by examiner

*Primary Examiner*—Chuong A. Luu
(74) *Attorney, Agent, or Firm*—Sughrue Mion, PLLC

(57) ABSTRACT

A method of forming self-aligned silicides is described and applied to a substrate having an isolation area, which divides the substrate into a first area and a second area. A resist protective oxide layer is formed on the substrate, and subsequently a mask layer is formed on the resist protective oxide layer. Further, the mask layer includes an opening on the first area and another opening on a contact hole of the second area. When a resist protective oxide process is performed, the mask layer protects the resist protective oxide layer underlying the same from being removed, whereas the resist protective oxide layer under the openings are removed. Therefore, silicides are controlled to form on the first area and the contact hole of the second area in a subsequent self-aligned silicidation process.

17 Claims, 4 Drawing Sheets

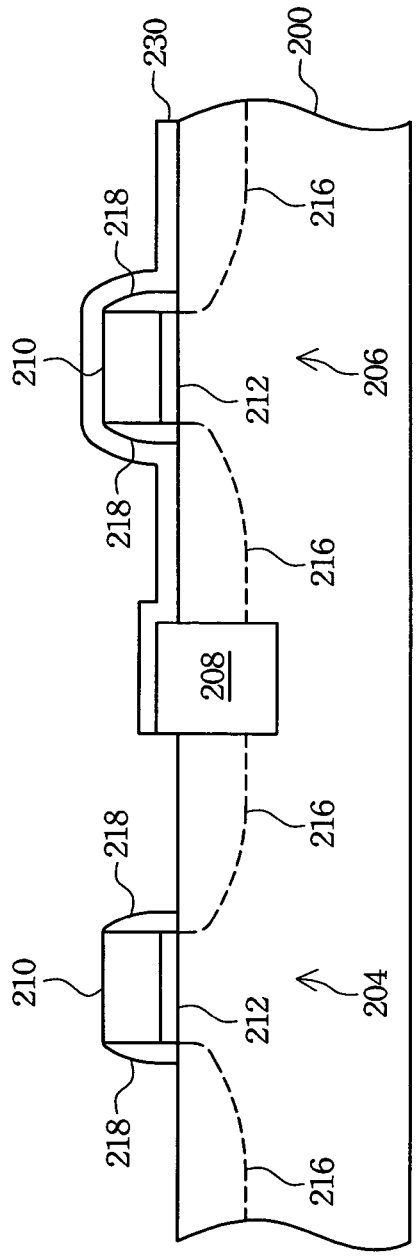
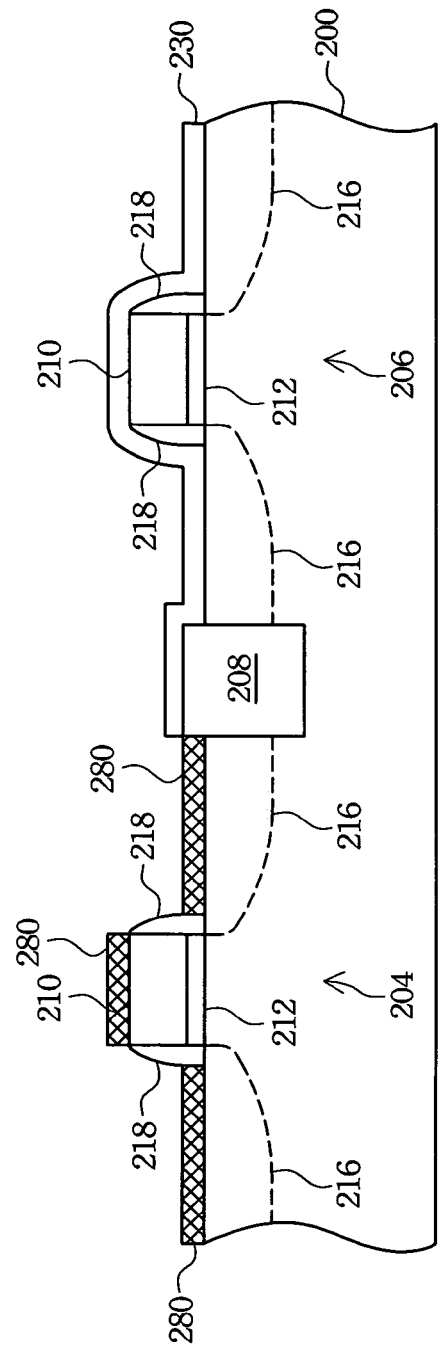

METHOD OF FORMING SELF-ALIGNED SILICIDES

FIELD OF THE INVENTION

The present invention relates to a method of forming self-aligned silicides, and more particularly, to a mask layout for a resist protective oxide (RPO) process and a method of forming the same.

BACKGROUND OF THE INVENTION

The semiconductor industry is developing so rapidly that related technologies and materials are evolving to improve ceaselessly the integration densities of integrated circuit devices and the performances thereof. As for the specific requirements of extremely fine devices and highly dense chips for sub-micron processes, the accuracy of pattern definition must be strictly observed, as well as the characteristics and qualities of areas in devices. For example, the intervals between each functional area of metal oxide semiconductor field effect transistors (MOSFETs), such as sources, drains, or gates, are closer due to the downsized MOSFETs. As a result, the sheet resistances of source/drain areas are increased. Therefore a self-aligned silicidation (SALICIDE) technology is adopted to lower the resistances of source/drain areas, and is applied widely in semiconductor processes.

The self-aligned silicidation process usually accompanies a resist protective oxide (RPO) process, by which a resist protective oxide layer is deposited on some device area of a wafer for protecting the area underlying the resist protective oxide layer from silicidation. The resist protective oxide process is also called SALICIDE blocking process. For brief description herein, "resist protective oxide process" is drafted through the whole application. FIG. 1 illustrates a portion of a prior art device area after performing the resist protective oxide process. Referring to FIG. 1, a device area 112 is separated from other active areas by a shallow trench isolation (STI) structure 108. Before the self-aligned silicidation process is performed, a resist protective oxide layer 125 is formed on the device area 112 not to be silicided. The formation of the area of the resist protective oxide layer 125, however, is not easily controlled. For instance, an over-etching step is generally used to remove the resist protective oxide layer on the shallow trench isolation structure 108 completely. Unfortunately, the overetch step inevitably etches away part of the shallow trench isolation structure 108, causing corners of the shallow trench isolation structure 108 to be recessed. The recessed corners lead to junction leakage associated with silicides formation in the following self-aligned silicidation process. In addition, the over-etching step may also etch away the edge 136 of the resist protective oxide layer 125 on which silicides are formed in the following self-aligned silicidation process, resulting in the decreasing resistance of the device area 112. Even though expanding the formation area of the resist protective oxide layer 125 horizontally may protect the edge 136 from being recessed by over-etching. The processes are operated more difficultly due to the closer intervals between the device area 112 and other active areas, as advancing to downsize resultant devices. As a result, the expanded resist protective oxide layer 125 influences on the properties of other active areas. Moreover, if too little etching is performed, traces of the resist protective oxide may contaminate other regions of the device area 112, such as, for instance, a contact hole. The resultant devices are thus unstable, and may even suffer from short circuits.

SUMMARY OF THE INVENTION

The objective of the present invention is to provide a mask layout and a method of forming the same for controlling the formation area of a resist protective oxide layer in a resist protective oxide (RPO) process, that increase the parameter-adjusting window of an etching process and further improve the successive self-aligned silicidation (SALICIDE) process to avoid unexpected formation of silicides.

According to the aforementioned objective of the present invention, on the one hand, a mask layout for a resist protective oxide process is provided. The parameter-adjusting window of an etching process is increased by means of the mask layout, which also aids in a sub-micron process or below. Therefore corners of a shallow trench isolation structure are less recessed, and consequently junction leakage is improved. Further, recessing of a resist protective oxide layer becomes easier to perform. Hence contamination by the resist protective oxide layer residue is reduced and the reliability of the resultant devices is enhanced effectively by using the mask layout of the present invention.

According to the aforementioned objective of the present invention, on the other hand, a forming method of a mask layout for a resist protective oxide process is provided, by which a resist protective oxide layer is formed properly. The resist protective oxide layer protects the area underlying it from formation of unexpected silicides, which further improves the operation of the following self-aligned silicidation process and preserves the resistances of devices thus produced.

The resist protective oxide process disclosed above is mentioned in the same breath as a SALICIDE blocking process or any denominate processes with similar concepts or functions, and hence is not proposed to limit the invention. The present invention achieves these benefits in the context of known processes. However, a further understanding of the nature and the advantages of the present invention are realized by reference to the latter portions of the specification and the drawings.

BRIEF DESCRIPTION OF THE DRAWINGS

The foregoing aspects, as well as many of the attendant advantages and features of this invention will become more apparent by reference to the following detailed description, when taken in conjunction with the accompanying drawings, wherein:

FIGS. 2A-2D illustrate schematic, cross-sectional views of various stages of a resist protective oxide process in accordance with the preferred embodiment of the present invention.

DETAILED DESCRIPTION OF THE PREFERRED EMBODIMENTS

The embodiment in accordance with the present invention is disclosed in detail as follows, taking in conjunction with the accompanying drawings. For describing the concept and spirit of the invention conveniently, a resist protective oxide process is drafted thereinafter to stand for a SALICIDE blocking process or any denominate processes having similar or identical functions or concepts.

Figure 1:
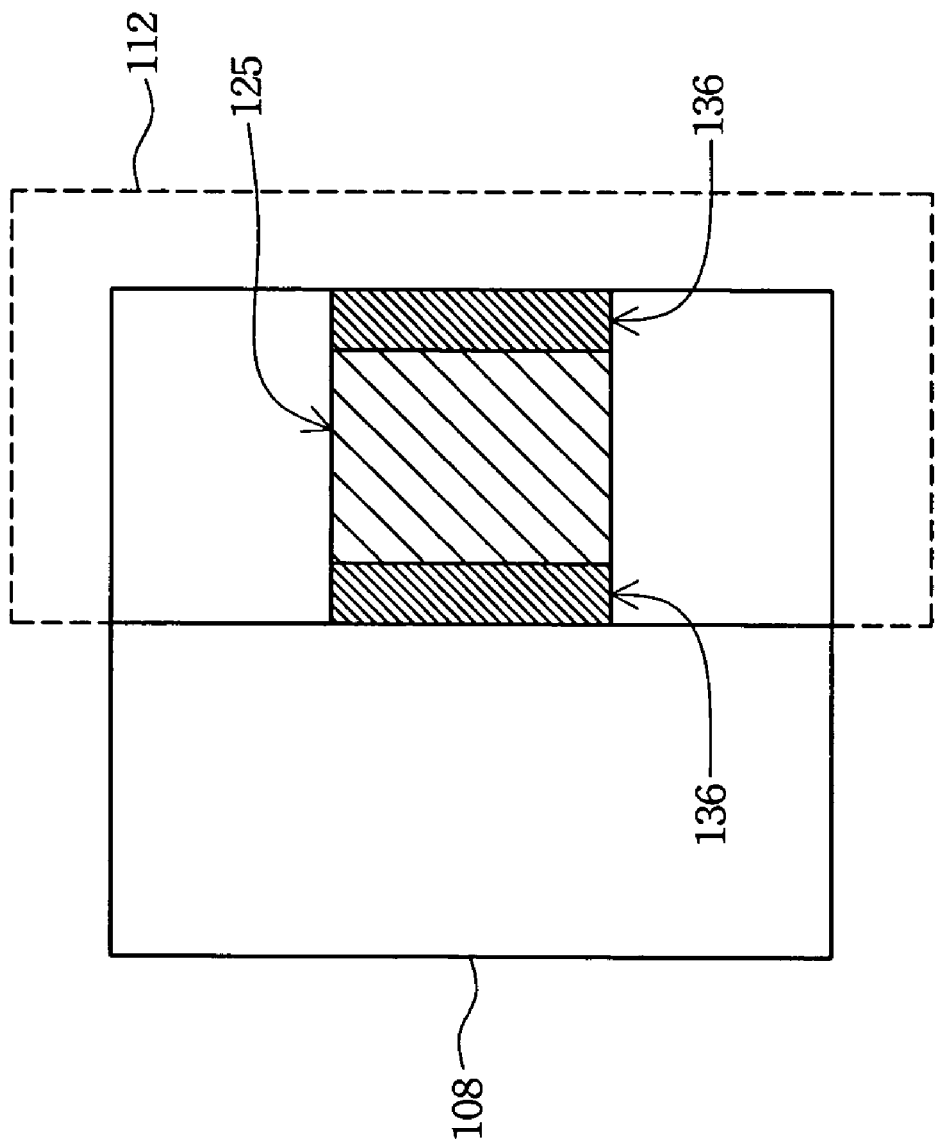
FIG. 1 illustrates a portion of a prior art device area after performing the resist protective oxide process.
Figure 2A:
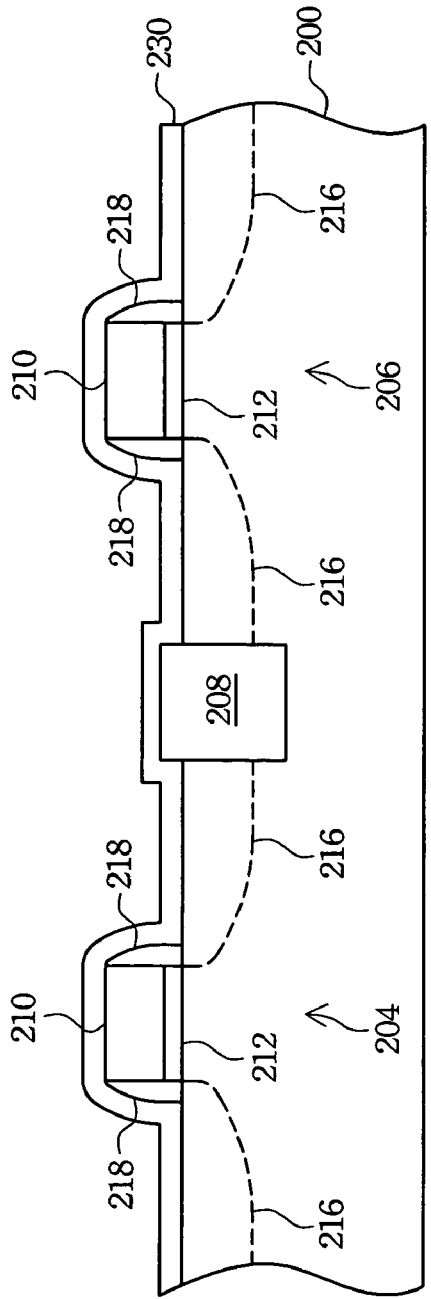
Figure 2B:
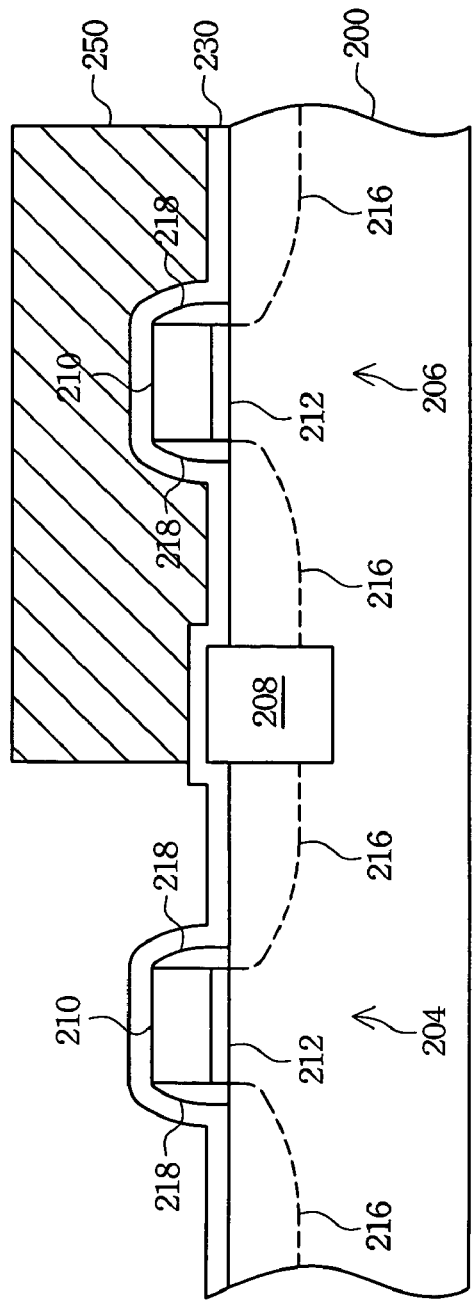

FIGS. 2A-2D illustrate schematic, cross-sectional views of various stages of a resist protective oxide (RPO) process in accordance with the preferred embodiment of the present invention. Referring to FIG. 2A, an isolation area is formed on a substrate 200 to separate active areas from one another. A shallow trench isolation (STI) structure or a local oxidation of silicon (LOCOS) structure may be used as the isolation area. In the preferred embodiment of the present invention, a shallow trench isolation structure 208 is formed on the substrate 200 and divides the substrate 200 into a first area 204 and a second area 206. Whether the first area 204 or the second area 206 is silicided depends on the properties of producing devices. For example, the area to be silicided usually produces logic devices, while memory devices are generally formed in the areas not to be silicided. The first area 204 is a silicided area, whereas the second area 206 is a non-silicided area in this preferred embodiment of the present invention. As illustrated in FIG. 2A, there are gates 210, gate dielectrics 212, and source/drain areas 216 on the first area 204 and the second area 206, respectively. Spacers 218, which typically are silicon nitride ($Si_3N_4$), tetra ethyl ortho silicate (TEOS), or a composite thereof, are also formed on the sidewalls of the gates 210. When the resist protective oxide process is performed, a resist protective oxide layer 230 is first formed on the substrate 200 by, for example, an ordinary chemical vapor deposition (CVD) process, like a low pressure chemical vapor deposition (LPCVD) process or a plasma-enhanced chemical vapor deposition (PECVD) process. The resist protective oxide layer 230 typically includes silicon oxide, silicon oxynitride (SiON), silicon nitride, or a composite thereof.

Figure 3:
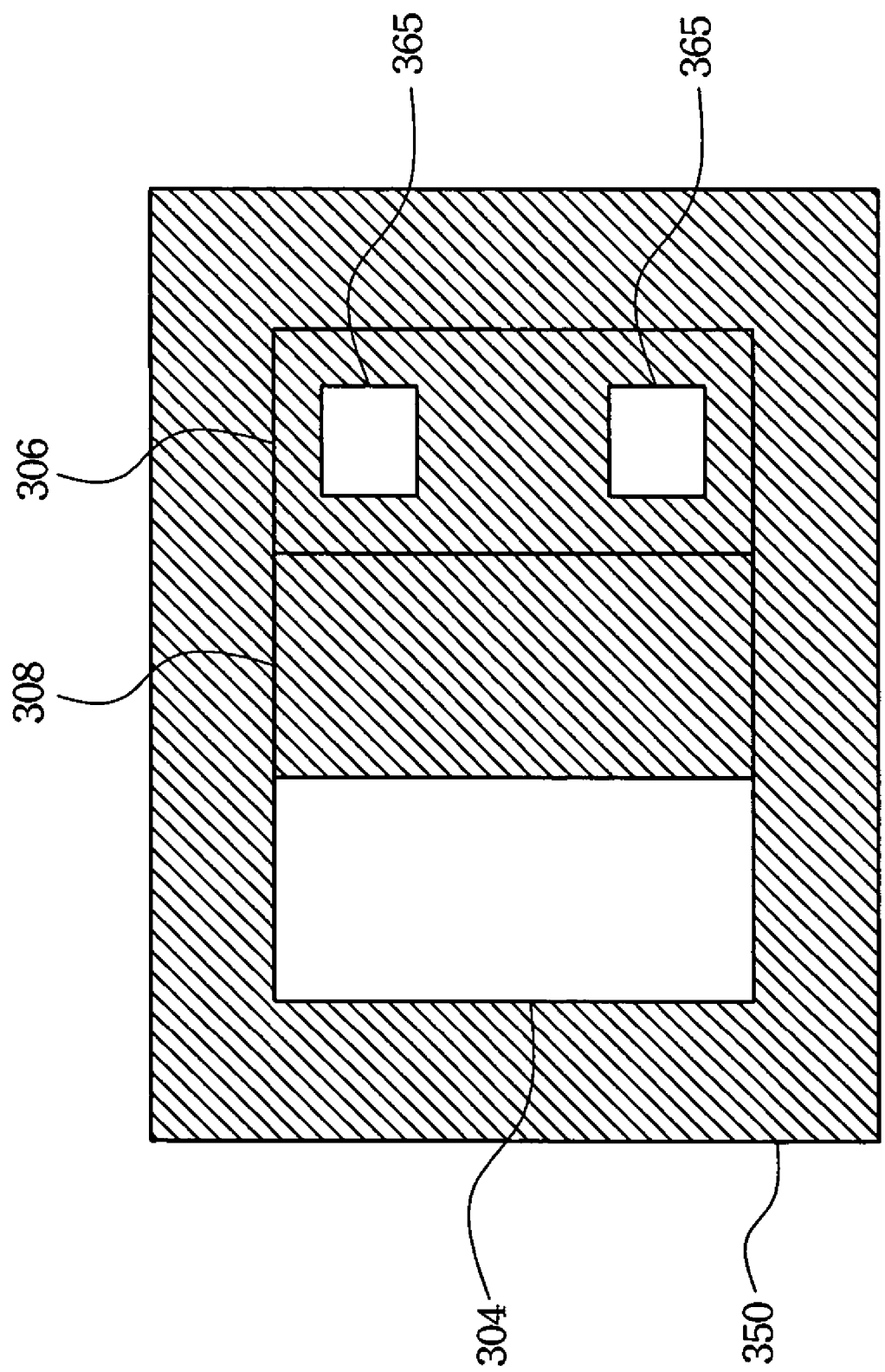
FIG. 3 illustrates a mask layout for a resist protective oxide process in accordance with the present invention.

In turn, the shape of a photoresist mask is defined to decide the area of the substrate for silicidation in a following self-aligned silicidation (SILICIDE) process. A mask layout for the resist protective oxide process in accordance with the present invention is shown in FIG. 3. The mask layout 350 has a first opening on the first area 304 and at least a second opening on a contact hole 365 of the second area 306, by which the formation area of a resist protective oxide layer is controlled. The mask layer formed by the mask layout 350 protects the resist protective oxide layer underlying the same from being removed, e.g. the resist protective oxide layer overlying a shallow trench isolation structure 308. On the other hand, the resist protective oxide layer under the openings is removed, i.e. the resist protective oxide layer on the first area 304 and the contact hole 365. Referring back to FIG. 2B and FIG. 2C, a mask layer 250 is formed on the substrate 200 by means of the mask layout 350 illustrated in FIG. 3. The resist protective oxide layer 230 on the first area 204 and the contact hole (not shown) of the second area 206 are then removed by conventional photolithography and etching processes, and hence the resist protective oxide layer 230 on the second area 206 and the shallow trench isolation structure 208 are preserved. The mask layer 250 is next recessed.

The mask layout 350 mentioned above is designed to comprise openings directly on the areas to be silicided and to leave the upper part of the shallow trench isolation structure 308. Therefore, the corners of the shallow trench isolation structure 308 are less recessed when removing the resist protective oxide layer by an etching process. Consequently, the junction leakage caused by the removal of the corners of the shallow trench isolation structure is improved. Moreover, there is no concern about the recess of the edge of the second area 306, because the resist protective oxide layer is protected by the mask layout 350 in the etching process. As a result, silicides are not formed on the edge of the second area 306 in the following self-aligned silicidation process, which prevents the resistance decrease of devices on the second area 306 and hence increases the reliability of the producing devices. On the other hand, only the resist protective oxide layer on the first area 304 and the contact hole 365 needs to be removed in the etching process according to the mask layout 350. Thus the contaminant of traces of the resist protective oxide layer is reduced dramatically. The parameter-adjusting window of the etching process is also increased, which further improves the successive self-aligned silicidation process in avoiding the unexpected formation of the silicides. Furthermore, the properties of the first area 304 and the second area 306 are not affected by limitations of processes, such as, for example, the definition accuracy of a lithography process, or the experimental conditions of an etching process, because the areas to be silicided are directly defined by the mask layout 350. Therefore, devices with small sizes are indeed produced according to the mask layout 350 despite a closer distance between the first area 304 and the second area 306.

Referring to FIG. 2D, silicides 280 are formed on the gate 210 and the source/drain areas 216 of the first area 204, as well as the contact hole (not shown) of the second area 206 by the self-aligned silicidation process. The silicides 280 may comprise titanium silicide ($TiSi_x$), cobalt silicide ($CoSi_x$), or tantalum silicide ($TaSi_x$). The formation of cobalt silicide is used here as an example. A cobalt (Co) layer is deposited by sputtering over the substrate 200 and then annealed by a rapid thermal annealing (RTA) treatment. The cobalt layer overlying the surface of the substrate 200 is reacted with silicon (Si) and transformed into cobalt silicide. The unreacted cobalt layer on the resist protective oxide layer 230 and the spacers 218 is next removed.

According to the aforementioned preferred embodiment of the present invention, the parameter-adjusting window of the etching process is increased in accordance with the mask layout of the present invention, so as to reduce contaminating traces of the resist protective oxide layer. The junction leakage is further improved for less recess of the corners of the shallow trench isolation structure. Furthermore, the formation area of the resist protective oxide layer is controlled properly to prevent the unexpected formation of the silicides. Therefore the self-aligned silicidation process is improved and the reliability of the producing devices is enhanced.

While the invention has been particularly shown and described with reference to the preferred embodiments thereof, these are, of course, merely examples to help clarify the invention and are not intended to limit the invention. It will be understood by those skilled in the art that various changes, modifications, and alterations in form and details may be made therein without departing from the spirit and scope of the invention, as set forth in the following claims.

What is claimed is:

1. A method of forming self-aligned silicides, comprising the steps of:

provideng a substrate having at least a first area and at least a second area, wherein the second area comprises at least a contact hole;

forming at least an isolation area on the substrate, wherein the first area and the second area are separated by the isolation area;

forming at least a gate, at least a gate dielectric, at least a spacer, and at least a source/drain area on the substrate;

forming a protective layer on the substrate and the isolation area after the gate, the gate dielectric, the spacer and the source/drain area are formed;

patterning the protective layer such that the protective layer has a first opening on the first area and a second opening on the contact hole of the second area, wherein the protective layer covers the isolation area after the protective layer is patterned; and performing a self-aligned silicidation process to form silicides on the first opening and the second opening.

2. The method of claim 1, wherein the isolation area is a shallow trench isolation structure.

3. The method of claim 1, wherein the protective layer is a resist protective oxide layer.

4. The method of claim 1, wherein the protective layer comprises silicon oxide, silicon oxynitride, silicon nitride, or a composition thereof.

5. The method of claim 1, wherein the silicides comprise titanium silicides, cobalt silicides, or tantalum silicides.

6. A method for manufacturing semiconductor devices, comprising the steps of:
   providing a substrate having at least a first area, at least a second area with at least a contact hole, and at least an isolation area, wherein the first area and the second area are separated by the isolation area;
   depositing a resist protective oxide layer on the substrate;
   patterning the resist protective oxide layer such that the resist protective oxide layer has a first opening on the first area and a second opening on the contact hole of the second area, wherein the resist protective oxide layer covers the isolation area after the resist protective oxide layer is patterned; and
   performing a self-aligned silicidation process to form silicides on the first area which is exposed by the first opening and on the contact hole of the second area, which is exposed by the second opening.

7. The method of claim 6, wherein the isolation area is a shallow trench isolation structure.

8. The method of claim 6, wherein the first area and the second area further comprise at least a gate, at least a gate dielectric, at least a spacer, and at least a source/drain area.

9. The method of claim 6, wherein the resist protective oxide layer comprises silicon oxide, silicon oxynitride, silicon nitride, or a composition thereof.

10. The method of claim 6 wherein the silicides comprise titanium silicides, cobalt silicides, or tantalum silicides.

11. A method for forming a mask layout applied to a self-aligned silicidation process, comprising the steps of:
   providing a substrate having at least a first area and at least a second area, wherein the second area has at least a contact hole;
   forming at least an isolation area on the substrate to separate the first area from the second area;
   forming a resist protective oxide layer on the substrate and the isolation area; and
   forming a mask layer on the resist protective oxide layer, wherein at least a part of the resist protective oxide layer is positioned between the mask layer and the isolation area; and
   patterning the mask layer such that the mask layer has a first opening on the first area and a second opening on the contact hole, wherein at least a part of the mask layer is positioned above the isolation area after the mask layer is patterned;
   removing the resist protective oxide layer under the first opening and the resist protective oxide layer under the second opening;
   removing the mask layer; and
   forming silicides on the first area and the contact hole.

12. The method of claim 2, wherein the step of removing the resist protective oxide layer under the first opening and the resist protective oxide layer under the second opening comprises using an etching process.

13. The method of claim 2, wherein the silicides comprise titanium silicides, cobalt silicides, or tantalum silicides.

14. The method of claim 11, wherein the isolation area is a shallow trench isolation structure.

15. The method of claim 11, wherein the first area and the second area further comprise at least a gate, at least a gate dielectric, at least a spacer, and at least a source/drain area.

16. The method of claim 11, wherein the step of forming a resist protective oxide layer comprises using a chemical vapor deposition process.

17. The method of claim 11, wherein the resist protective oxide layer comprises silicon oxide, silicon oxynitride, silicon nitride, or a composition thereof.

* * * * *